United States Patent [19]

Slodzian et al.

[11] Patent Number: 4,564,758
[45] Date of Patent: Jan. 14, 1986

[54] PROCESS AND DEVICE FOR THE IONIC ANALYSIS OF AN INSULATING SAMPLE

[75] Inventors: Georges Slodzian; Marcel Chaintreau; Roger Dennebouy, all of Orsay, France

[73] Assignee: Cameca, Courbevoie, France

[21] Appl. No.: 575,828

[22] Filed: Feb. 1, 1984

[51] Int. Cl.[4] .......................................... H01J 37/252
[52] U.S. Cl. .................................... 250/309; 250/310; 250/285; 250/281; 250/282
[58] Field of Search ............... 250/309, 310, 306, 307, 250/285, 281, 282, 288, 423

[56] References Cited

U.S. PATENT DOCUMENTS 2,901,627  8/1959  Wiskott et al. ...................... 250/310

FOREIGN PATENT DOCUMENTS 2111481 of 0000 France .
918297 of 0000 United Kingdom .

OTHER PUBLICATIONS

Werner et al., "Charging of Insulators ...", Journal of Applied Physics, vol. 47, No. 4, Apr. 1976, pp. 1232-1242.
Hines et al., "Sputtering of Vitreous Silica ...", Journal of Applied Physics, vol. 32, No. 2, Feb. 1961, pp. 202-204.
Japanese Journal of Applied Physics, vol. 16, No. 8, Aug. 1977, Tokyo (JP) K. Nakamura et al.: "Detection of $SiO_2$ from $SiO_2Si$ — Interface by Means ...".

Primary Examiner—Alfred E. Smith
Assistant Examiner—Jack I. Berman
Attorney, Agent, or Firm—Roland Plottel

[57] ABSTRACT

The invention provides a process and device for the ionic analysis of an insulating sample brought to a given negative potential, of the type in which a target on the surface of the sample to be analyzed is bombarded by means of a primary electron beam and negative ions emitted by the bombarded target are used for producing an ion image of the sample. An electron beam whose normal speed component cancels out just at level of the surface of the target is directed perpendicularly to the target.

The device comprises for this purpose a filament, brought substantially to the same negative potential as the sample, which emits the electron beam. The electron beam, after emission, is deflected by a magnetic prism so as to be brought into coincidence with the optical axis of the negative ion beam emitted by the target.

5 Claims, 5 Drawing Figures

PROCESS AND DEVICE FOR THE IONIC ANALYSIS OF AN INSULATING SAMPLE

BACKGROUND OF THE INVENTION

1. Field of the Invention

The invention relates to a process and device for the ionic analysis of an insulating sample.

Conventionally, in spectroscopy, a target at the surface of the sample to be analyzed is bombarded by a beam of primary ions. The target then emits negative ions which are collected by a system which gives the distribution pattern of the elements present at the surface of the sample.

This technique is satisfactory for samples which are sufficiently conducting.

But, a large number of samples examined by the ionic analyser are insulating: polished rock sections, sections of teeth or bones, sections of biological tissues, oxide inclusions, oxide layers, passivation layers . . . Observation of these samples causes problems because the electric charges flow badly. Even when a balance is reached between the flows of charges received, emitted and evacuated by low conductivity, charge excesses or defects may exist locally and create potentials which stagger the energy distributions of the secondary ions, deform the paths of the secondary ions which will form the images and modifiy the primary bombardment conditions. Furthermore, the electric fields may be locally very intense and induce the migration of a number of elements. This phenomenon is particularly visible when implantation or diffusion profiles in silica layers on semi-conductors are plotted.

2. Description of the Prior Art

This problem has been partially solved in the case where, for removing the positive ions emitted by the target, a metal grid is deposited by evaporation on the surface. The insulating areas of the sample received, in addition to the primary ion beam, low energy secondary electrons emitted by the bars of the grid and high energy electrons produced on the extraction electrode and attracted by the sample. Control of the surface potential of the sample is then obtained by suitably adjusting the density of the primary bombardment.

On the other hand, when it is a question of negative secondary ions, on the one hand the electrons produced on the extraction electrode are pushed back by the sample and, on the other hand, the electrostatic field extracts at the same time the secondary electrons emitted by the target: the emission of secondary electrons is much more intense then the ionic emission, so that, whatever the sign of the primary bombardment ions, a positive charge always appears at the surface. This emission is further increased when the output work is lowered by a $Cs^+$, $K^+$ bombardment or by Cs vapor blowing. Moreover on heterogeneous samples, this charge may vary from one place to another depending on the secondary electron output of the location considered. Experience shows that this positive charge is such that any ionic microscopy from negative secondary ions is impossible with conventional procedures.

SUMMARY OF THE INVENTION

The aim of the invention is to remove this impossibility by providing a process for effectively suppressing charge effects.

This aim is reached in accordance with the invention by directing, perpendicularly to the target, an electron beam whose normal speed component is cancelled out just at the level of the surface of the target. Thus, any positive charge appearing at the surface is immediately neutralized without fear of an excess negative charge for, since the electrons are slow, they are pushed back as soon as the surface becomes slightly negative. Another major advantage of the invention is then to supply the surface of the sample with electrons without these latter having a harmful interaction with the sample (such as the problems of diffusion of some elements under electron bombardment of too high an energy, or cracking problems.)

Advantageously, a filament brought substantially to the same negative potential as the sample emits said electron beam.

Advantageously, the electron beam is, after emission, deflected by a magnetic prism so as to be brought into coincidence with the optical axis of the negative ion beam emitted by the target.

Advantageously, electrons leaving the target along the optical axis are used for obtaining an electron image of the sample.

The invention also provides a device for the ionic analysis of an insulating sample brought to a predetermined negative potential, of the type which comprises a primary bombardment ion source directed on a target at the surface of the sample to be analyzed and, in the optical axis of the device, a mass spectrograph.

According to the invention, said device also comprises a source brought substantially to the potential of the sample emitting an electron beam and means for directing said beam on said target perpendicularly to the bombardment surface.

Advantageously, said means consist of a magnetic prism and magnetic compensation is provided for the deflection by said prism of the path of the negative ions emitted by the target.

Advantageously, the prism is a double magnetic prism, deflecting the electrons which leave the target along the optical axis and a second analyser is provided delivering an electron image of the sample.

BRIEF DESCRIPTION OF THE DRAWINGS

The invention will be better understood from reading the non limiting description of a preferred embodiment, made with reference to the accompanying drawings in which.

DETAILED DESCRIPTION OF THE PREFERRED EMBODIMENT

Figure 1:
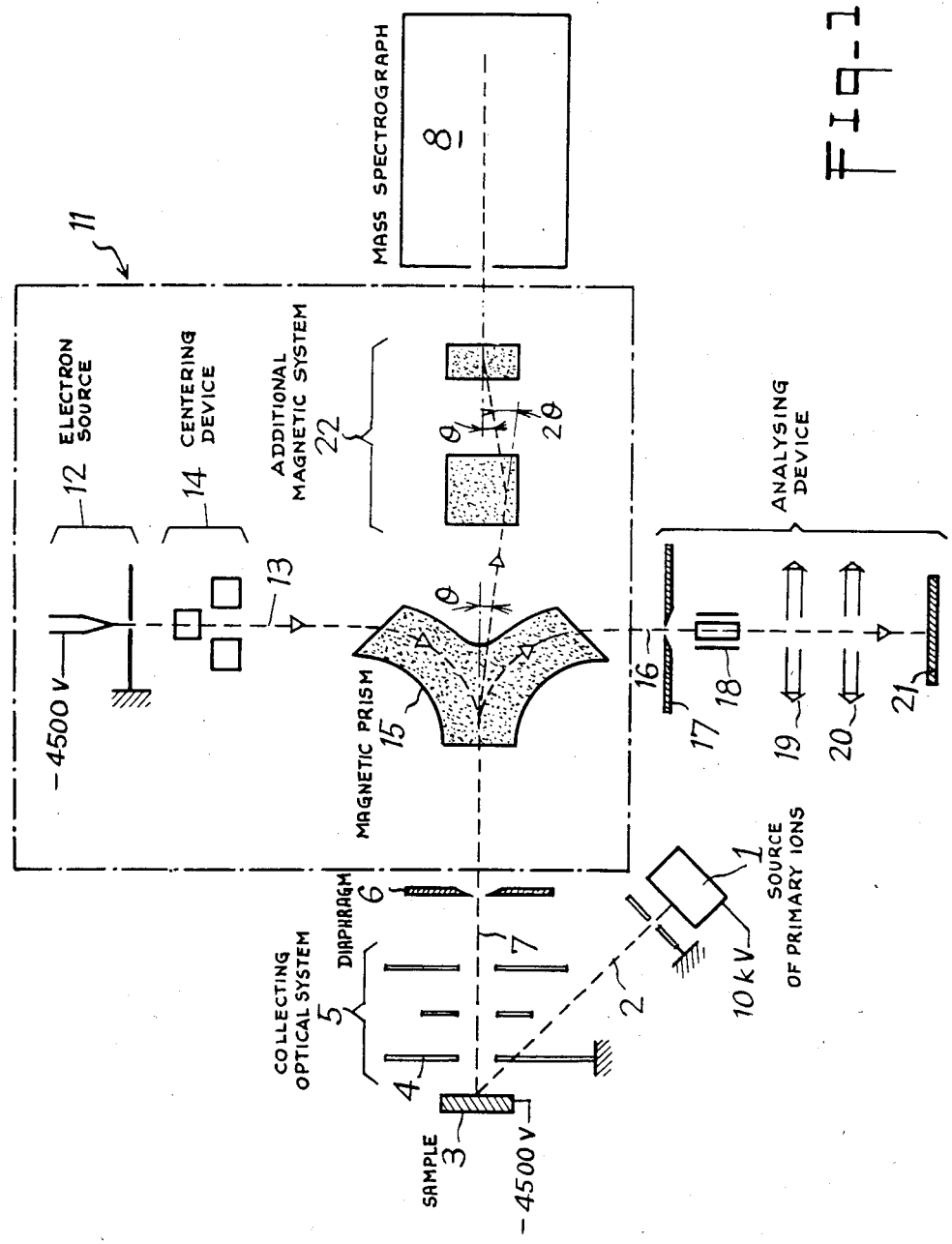
FIG. 1 is a diagram of the ionic analysis device in accordance with the invention.

In FIG. 1 can be seen a source 1 of primary ions brought to a potential of 10 kV bombarding, with an ion beam 2, a target at the surface of sample 3 brought to a potential of $-4\ 500$ V.

The secondary negative ion beam emitted by the target is accelerated by the extractor electrode 4, at ground potential, passes through a collecting optical system 5 then through diaphragm 6 situated at the crossover. Along the same optical axis 7 is disposed the mass spectrograph 8 to which the present invention does not relate.

According to the invention, between diaphragm 6 and spectrograph 8 is inserted a system 11 for suppressed charge effects. This system 11 comprises an electron source 12 situated on an axis 13 intersecting the general optical axis 7 at an angle which, in the Figure is 90°. The electrons are provided by a filament brought to a potential of −4 500 V; they are accelerated by an extractor electrode at 0 potential and thus through a conventional centering device 14. They are deflected by a magnetic prism 15 which thus brings them back along the optical axis. At the output of prism 15, the electron beam passes through diaphragm 6, a common cross-over for the ion beam and the electron beam; then it passes through the emission lens 5 and arrives in the zone situated between the object 3 and the extractor electrode 4, in which zone reigns the electric field for accelerating the negative particles emitted by the surface. This electric field then brakes the electrons, their energy decreases gradually and is cancelled out substantially at the level of the surface. The emission lens 5 acts on the electron parts as it does on those of the negative ions. The result is that the electrons arrive at the surface with a lateral speed component which is very small, their normal component at the surface being zero or practically zero (and in any case not creating any harmful interaction with the sample). The electrons which are not used for neutralizing the surface of the sample turn back, with secondary electrons emitted by the surface of the sample (and naturally with the negative ions).

The magnetic prism 15 used for deflecting the discharge electrons through 90° is advantageously double; it deflects in the reverse direction the electrons leaving the target, thus making possible observation of the electron image formed from the back scattered or reflected electrons, or else that of the image obtained with the secondary electrons produced either by primary ionic bombardment or by impact of the incident electrons. To this end, an associated analyzing device, which is known per se, is provided in the path of the deflected electron beam 16: selection plates 7, electrostactic centering 18, a post-accelerating optical system 19, a projection optical system 20, a screen 21.

The presence of prism 15 in the optical axis 7 also produces a slight deflection through angle $\theta$ of the path of the secondary ions. An additional magnetic system 22 is therefore provided for compensating this rotation whatever the mass of the secondary ions.

Figure 2A:
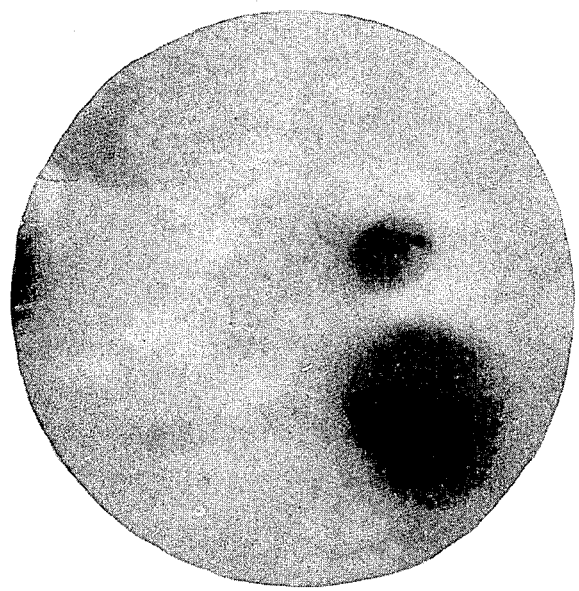
FIGS. 2a and 2b are photographs of an ionic image of the same sample under conventional analysis in FIG. 2a and in accordance with the invention in FIG. 2b.

FIG. 2a shows a general ion image—that is to say without mass filtering of the ions—obtained by ion bombardment of an ion die. The dark spots correspond to disturbances of the secondary ion emission induced by the presence of small alumina precipitates (respective dimensions about 10 and 20 micrometers) having very low electric conductivity.

Figure 2B:
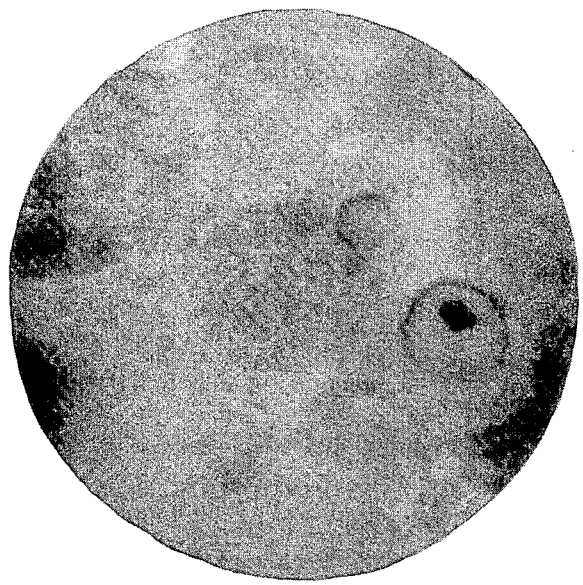

FIG. 2b shows an ion image obtained under the same ion bombardment conditions but, this time, with the use of a low energy electron beam (<10 eV) in accordance with the invention. The image of the alumina precipitates becomes perceptible, giving information about the real dimensions of these objects and showing for each of them the existence of an internal structure.

Figure 3A:
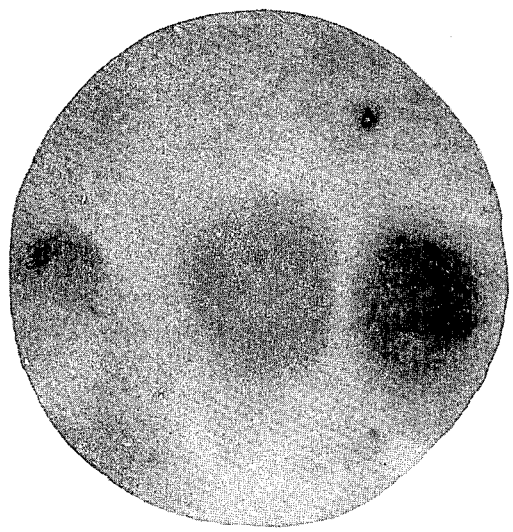
FIGS. 3a and 3b are similar photographs of another sample.

FIG. 3a is a general ion image obtained, as before, by bombarding an iron target—a metal which is rich in insulating alumina precipitates.

Figure 3B:
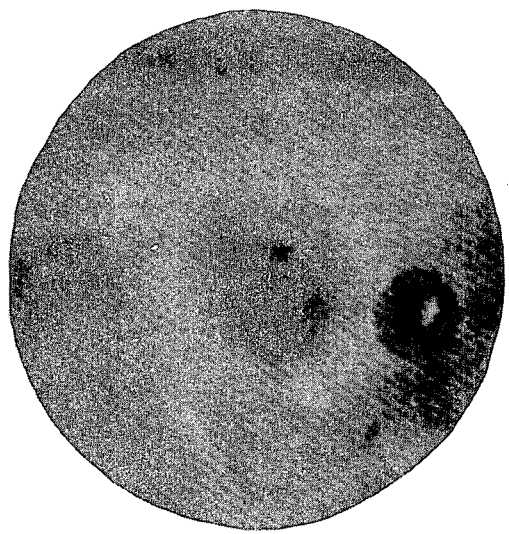

In FIG. 3b, the slow electron beam has this time been localised on the alumina precipitate situated on the right of the preparation. The effect of the electron bombardment can be discretely felt at the level of the precipitate situated in the centre of the image. One of the merits of this procedure for neutralizing the electrostatic charges is that it is self-adjustable.

Adaptation of this device for discharging insulating samples to a conventional ion analyzer allows the analysis to be made, impossible up to now, of negatively charged oxygen ions emitted from insulating material, such as most of the compounds of oxygen, oxides and silicates, and makes possible the pin point analysis of the iosotopic composition of this element in objects of interest in the astrophysical sphere: key mineral phases of meteorite, interplanetary dust.

Moreover, the process of the invention, which in no wise modifies the physical or chemical appearance of the sample analyzed, allows all sorts of in situ analyses whose non destructive character is of primary importance.

What is claimed is:

1. A process for ionic analysis of an insulating sample brought to a given negative potential, of a type in which a target on the surface of the sample to be analyzed is bombarded by means of a primary ion beam and negative ions emitted by the bombarded target are used for producing an ion image of the sample, wherein an electron beam, whose normal speed component cancels out just at the level of the surface of the target, is directed perpendicularly to the target, said electron beam being, after emission, deflected by a magnetic prism so as to brought into coincidence with the optical axis of the negative ion beam emitted by the target.

2. The process as claimed in claim 1, wherein the electrons leaving the target along the optical axis are used for obtaining an electron image of the sample.

3. The process as claimed in claim 2, wherein a filament brought substantially to said given negative potential emits said electron beam.

4. A device for the ionic analysis of an insulating sample brought to a given negative potential, of the type which comprises a source of primary bombardment ions directed on a target at the surface of the sample to be analyzed and, along the optical axis of the device, a mass spectrograph using negative ions emitted by the bombardment target for producing an ion image of the sample, further comprising a source brought substantially to the potential of the sample emitting an electron beam, and deflecting means for directing this electron beam onto the target, perpendicularly to the bombarded surface and wherein said deflecting means comprise a magnetic prism and a system is provided for magnetically compensating the deflection by said prism of the path of the negative ions emitted by the target.

5. The device as claimed in claim 4, wherein the prism is a double magnetic prism, deflecting the electrons which leave the target along the optical axis and an associated analyzer is provided delivering an electron image of the sample.

* * * * *